United States Patent [19]
Welborn

[11] Patent Number: 5,649,074
[45] Date of Patent: Jul. 15, 1997

[54] RASTER IMAGE DATA COMPRESSION METHOD AND SYSTEM

[75] Inventor: Patrick E. Welborn, Lake Oswego, Oreg.

[73] Assignee: Hewlett-Packard Company, Palo Alto, Calif.

[21] Appl. No.: 382,470

[22] Filed: Jan. 31, 1995

[51] Int. Cl.⁶ .................................................. G06K 15/00
[52] U.S. Cl. ........................................... 395/114; 395/115
[58] Field of Search ...................... 395/114, 115, 395/116, 507–518, 521, 101; 358/426, 261.1, 261.2, 261.3, 427, 261.4, 262.1, 430, 431, 432, 433; 382/239, 244, 246, 232, 238, 250, 245; 341/51, 55, 65, 95, 63

[56] References Cited

U.S. PATENT DOCUMENTS 5,060,286 10/1991 Miller ........................................ 382/239
5,452,405 9/1995 Vondran, Jr. ............................ 395/114

Primary Examiner—Edward L. Coles, Sr.
Assistant Examiner—Dov Popovici

[57] ABSTRACT

Data compression apparatus includes a current block of data bytes and a logic circuit for determining whether each byte in the current block is the same or different from a seed value. An encoding circuit produces a compressed version of the current block, which includes Command bytes and continuous literal data bytes from the current block. Each Command byte has an encoding identifier, an offset count and a data segment replacement count. Each offset count and data segment replacement count have, respectively, maximum bit sizes (and values). The encoding circuit responds to an indication that a data segment (1) differs from the seed value and (2) is followed by a series of contiguous data segments that are different from the seed value, by causing (a) a first Command byte to manifest a data segment replacement count of the maximum value and an offset count of 0 and to be followed by at least one of the contiguous data segments from the series. Thereafter, a next Command byte occurs if the remaining number of contiguous data segments exceeds the maximum value of the data segment replacement count. The next Command byte(s) each manifest maximum value data segment replacement counts until the count value ≦ the data segment Replacement count. If the offset count is: greater than the offset count maximum value, the offset count is set to its maximum value. Subsequent Command bytes follow until the remaining offset count value is ≦ to the maximum value or a lesser value.

9 Claims, 2 Drawing Sheets

SEED BLOCK

| 0 0x00 | 1 0x01 | 2 0x02 | 3 0x03 | 4 0x04 | 5 0x05 | 6 0x06 | 7 0x07 | 8 0x08 | 9 0x09 | 0x0A | 0x0B | 0x0C | 0x0D |
|---|---|---|---|---|---|---|---|---|---|---|---|---|---|
| 0x0E | 0x0F | 0x10 | 0x11 | 0x12 | 0x13 | 0x14 | 0x15 | 0x16 | 0x17 | 0x18 | 0x19 | 0x1A | 0x1B |
| 0x1C | 0x1D | 0x1E | 0x1F | 0x20 | 0x21 | 0x22 | 0x23 | 0x24 | 0x25 | 0x26 | 0x27 | 0x28 | 0x29 |
| 0x2A | 0x2B | 0x2C | 0x2D | 0x2E | 0x2F | | | | | | | | |

FIG. 4

CURRENT BLOCK

| 0 0x00 | 1 0x01 | 2 0x32 | 3 0x33 | 4 0x34 | 5 0x05 | 6 0x06 | 7 0xFF | 8 0xFF | 9 0xFF | 10 0xFF | 11 0x0B | 12 0x0C | 13 0x0D |
|---|---|---|---|---|---|---|---|---|---|---|---|---|---|
| 14 0x0E | 15 0x0F | 16 0x10 | 17 0x11 | 18 0x12 | 19 0x13 | 20 0x14 | 21 0x15 | 22 0x16 | 23 0x17 | 24 0x18 | 25 0x19 | 26 0x1A | 27 0x1B |
| 28 0x1C | 29 0x1D | 30 0x1E | 31 0x1F | 32 0x20 | 33 0x21 | 34 0x22 | 35 0x23 | 36 0x24 | 37 0x25 | 38 0x86 | 39 0x87 | 40 0x88 | 41 0x89 |
| 42 0x8A | 43 0x8B | 44 0x8C | 45 0x8D | 46 0x8E | 47 0x2F | | | | | | | | |

FIG. 5

DELTA BLOCK

| 0 0x00 | 1 0x00 | 2 0x30 | 3 0x30 | 4 0x30 | 5 0x00 | 6 0x00 | 7 0xF8 | 8 0xF7 | 9 0xF6 | 10 0xF5 | 11 0x00 | 12 0x00 | 13 0x00 |
|---|---|---|---|---|---|---|---|---|---|---|---|---|---|
| 14 0x00 | 15 0x00 | 16 0x00 | 17 0x00 | 18 0x00 | 19 0x00 | 20 0x00 | 21 0x00 | 22 0x00 | 23 0x00 | 24 0x00 | 25 0x00 | 26 0x00 | 27 0x00 |
| 28 0x00 | 29 0x00 | 30 0x00 | 31 0x00 | 32 0x00 | 33 0x00 | 34 0x00 | 35 0x00 | 36 0x00 | 37 0x00 | 38 0xB0 | 39 0xB0 | 40 0xB0 | 41 0xB0 |
| 42 0xB0 | 43 0xB0 | 44 0xB0 | 45 0xB0 | 46 0xB0 | 47 0x00 | | | | | | | | |

FIG. 6

RASTER IMAGE DATA COMPRESSION METHOD AND SYSTEM

FIELD OF THE INVENTION

This invention relates to data compression techniques and, more particularly, to a data compression technique which utilizes constant length control words for all data compression encoding.

BACKGROUND OF THE INVENTION

Data compression is used to reduce the amount of data transmitted between source and destination nodes and to further reduce the amount of memory required to store the data. Data compression is almost invariably used when transmitting a raster image between a host processor and a printer. A presently favored data compression technique for raster data operates on a "delta" basis wherein a "current" raster image row is compared with a prior image raster row and only values in the current row that differ from the prior row are transmitted. The compression operation outputs a delta compression data string which consists of a command byte followed by optional offset count bytes, optional replacement count bytes and the actual replacement data.

In FIG. 1, an exemplary delta compression data string is illustrated and in FIG. 2, details of the command byte of FIG. 1 are shown. The Command byte includes three distinct portions:

(1) a control bit which indicates whether the replacement data is encoded and what decoding scheme is utilized;

(2) an offset count (four bits) which defines a number of bytes that the replacement data is offset from a current position in a seed row; and (3) a replacement count (three bits) which indicates a number of consecutive data bytes to be replaced.

If the control bit is zero, the replacement data is uncompressed or "literal" bytes from the raster data row. If the control bit equals 1, the replacement data is run length encoded.

Replacement count bits (0–2) contain a count of the number of bytes to be replaced by literal bytes following the command byte in the encoded data stream. The Offset count is the location where the replacement bytes start relative to a current position in the seed row. A current byte follows the last replacement byte or, at the beginning of a row, the left graphics margin. An offset of zero is the current byte; an offset of one is the byte following the current byte, etc. etc.

Note that the Offset count, being four bits in length, has a maximum numeric value of 15. In this prior art system, if the offset count is 15 or greater, an Offset count byte value follows the Command byte and is added to the Command byte's offset count to achieve an actual offset count. Even if the Offset count is equal to 15, an Offset count byte must follow and will indicate a value of 0, indicating that the Offset count is 15.

In similar fashion, if the Replacement count is 7, a Replacement count byte must follow the Command byte and any Offset count bytes. If the Replacement count byte is 0, then 8 bytes are replaced (i.e. bytes 0 to 7). If the Replacement count byte is 255 (i.e. a byte of all ones), another Replacement count byte follows. The last Replacement count byte is always less than 255. All Replacement count bytes are added to the Replacement count in the Command byte to obtain the total Replacement byte count. One more byte than the total Replacement count is replaced.

As can be seen from the above, the prior art compression procedure accommodates Offset count values greater than 15 and Replacement count values greater than 7 by appending Offset count bytes and Replacement count bytes, as the case may be. In fact, when the Replacement count value or the Offset count value are at their maximum (i.e., 7 and 15 respectively), count the Command byte must be followed by either an Offset byte or a Replacement count byte. Thus, while the described prior art compression procedure exhibits excellent compression characteristics, it requires specially configured hardware to handle the variable length control bytes to enable the compression action and add an undesirable cost element to the hardware.

Accordingly, it is an object of this invention to provide an improved system for data compression wherein all compression control data elements are of an identical bit size.

It is another object of this invention to provide an apparatus for data compression which employs constant size control bytes to enable lower cost compression apparatus to be configured.

SUMMARY OF THE INVENTION

Data compression apparatus includes a memory for storing a current block of data segments (e.g. bytes) and a logic circuit for determining whether each byte in the current block is the same or different from a seed value. An encoding circuit coupled to the logic circuit produces a compressed version of the current block, which compressed version includes Command bytes and contiguous literal data bytes from the current block. Each Command byte has an encoding identifier, an Offset count and a data segment Replacement count. Each Offset count and data segment Replacement count manifest respectively limited bit sizes (and values). The encoding circuit responds to an indication that a data segment (1) differs from the seed value and (2) is followed by a series of contiguous data segments in the current block that are also different from the seed value (the series exceeding in number the limited value of the data segment Replacement count), by causing (a) a first Command byte to manifest a data segment Replacement count of the limited value and an Offset count of 0 and (b) the first Command byte to be followed by at least one of the contiguous data segments from the series. Thereafter, a next Command byte occurs if the remaining number of contiguous data segments exceeds the limited value of the data segment Replacement count. The next Command byte(s) each manifest limited value data segment Replacement counts until the count value is either equal to or less than the data segment Replacement count (which is manifest by a last Command byte). Similarly, if the Offset count is greater than the Offset count limited value, the Offset count will be set to its maximum limited value, followed by a data segment Replacement count of 0 (indicating no action to be taken). A subsequent Command byte (or commands bytes) follow until the remaining Offset count value manifest by a Command byte is either equal to the limited value or a lesser value.

DESCRIPTION OF THE DRAWINGS

FIG. 4 is a representative seed block of hexadecimal encoded bytes.

FIG. 5 is a representative current block to be encoded using the method of the invention.

FIG. 6 is a delta block representing those bytes in the current block which are different from the seed block.

DETAILED DESCRIPTION OF THE INVENTION

Figure 3:
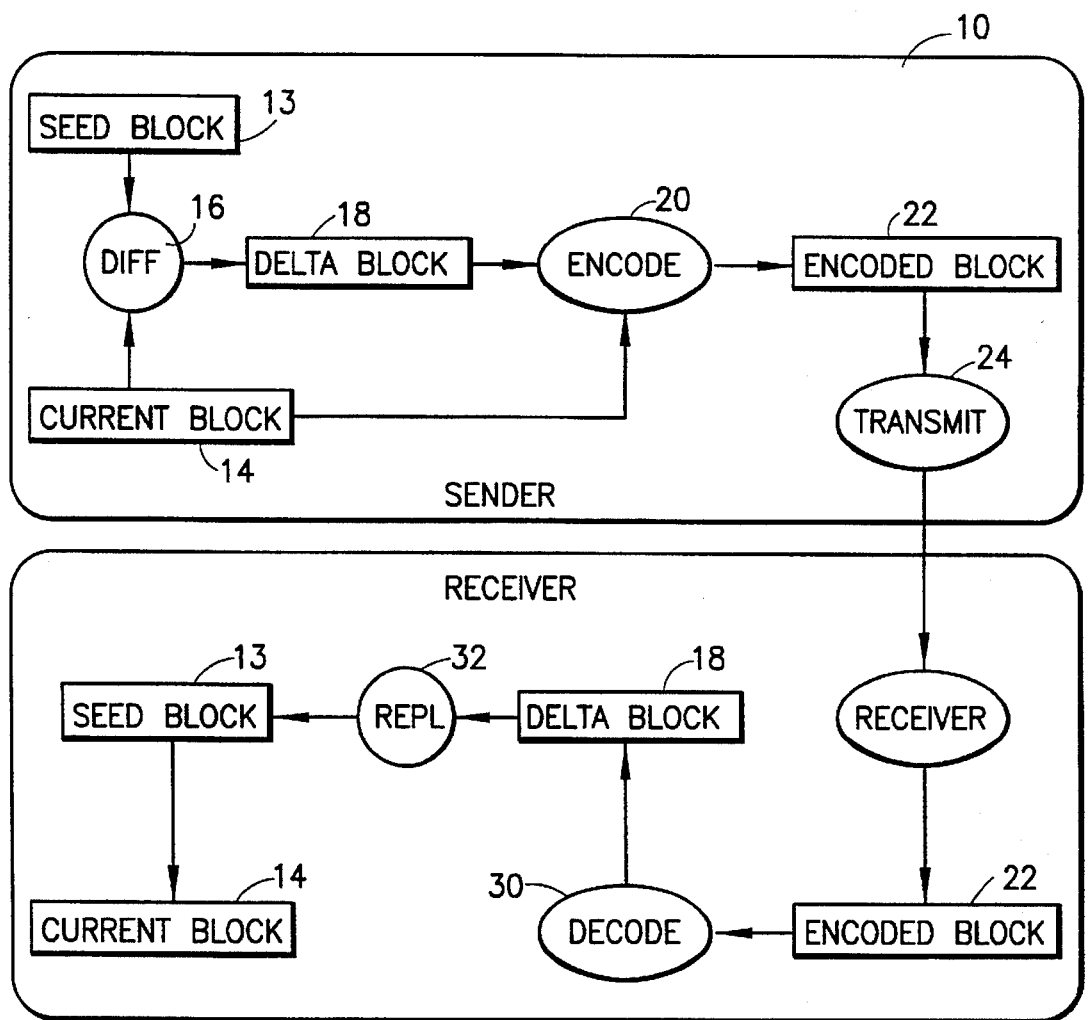
FIG. 3 is a block diagram of sender and receiver modules which both encode and decode data encoded in accordance with the method of the invention.

Referring to FIG. 3, a high level block diagram is illustrated of both a sender module and a receiver module wherein the encoding and decoding procedures of the invention are carried out. Hereafter, both a seed block and a current block of data will be referred to as being encoded in byte-size data segments, however, it is understood by those skilled in the art that other size data segments are to be considered as being within the scope of the invention.

Hereafter, certain terms will be used in accordance with the following definitions:

Block: A block of data is any list of data; the data may be of any size and the list may be of any length.

Seed Block: A seed block is a list of bytes representing a block of data that is employed to encode the data of a current block.

Current Block: A current block is the list of bytes currently being compressed or decompressed.

Delta Block: A delta block indicates which bytes are different between a seed block and a current block.

Encoded Block: An encoded block is a block of data transmitted from the sender to the receiver that is encoded in accordance with the procedure of the invention.

Offset: An offset is a count from a current byte position to another byte position;

In FIG. 3, data movement between a sender 10 and a receiver 12 is shown which incorporates the data compression encoding invention hereof. Sender 10 includes a memory which stores a seed block 13 and a current block 14. A representative seed block 13 is shown in FIG. 4 and a representative current block is shown in FIG. 5. A difference module 16 compares corresponding position bytes occurring in seed block 13 and current block 14 and outputs a code if the bytes are different. If the bytes are the same, a zero value is output. The result of the operation of difference module 16 is a delta block 18, as shown in FIG. 6. Both delta block 18 and current block 14 are fed to an encode module 20 wherein the encoding procedure of the invention is carried out. The result is an encoded, compressed data block 22 which is transmitted via transmit module 24 to receiver 12. There, encoded compressed data block 22 is reconstructed in decode module 30 back to the delta block form 18. A replacement module 32 then employs data from seed block 13 and replacement data from the delta block to reconstruct current block 14.

Figure 1:
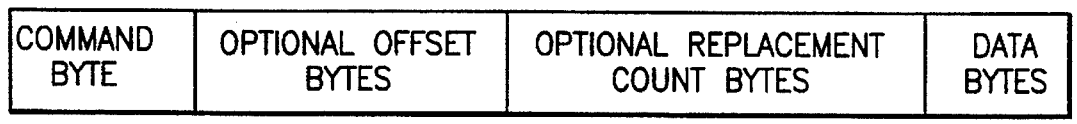
FIG. 1 is a diagram of a prior art delta compression data string comprising a Command byte, optional Offset bytes, optional Replacement bytes, and the replacement data.
Figure 2:
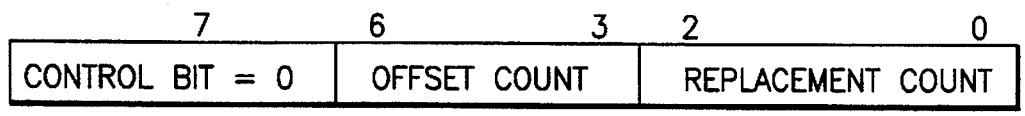
FIG. 2 is a prior art Command byte indicating bit positions assigned to an encoding control bit and Offset count and Replacement count values.

To implement the invention, the Command byte of FIG. 2 is employed, but optional offset bytes and optional replacement count bytes are eliminated. In lieu thereof, the Command byte is caused to manifest Offset count and Replacement count values which, together, signal to decode module 30 that a further Command byte will be required to fully encode or decode a section of bytes from encoded block 22.

In brief, when a next current block byte (that differs from a seed block byte) is offset from a previous differing byte by a byte count of greater than 15 (the maximum value for the Offset count), the Offset count in the Command byte is set equal to 15 and the Replacement count value is set equal to 0. A Replacement count value of 0 is taken as an indication that no action is to be taken. A second Command byte is then inserted and its Offset count value is set to either the maximum value or to some lesser value, depending upon the number of offset bytes between succeeding bytes that differ from seed bytes. If, again, the Offset count is greater than 15, the Replacement count value is again set to 0 in the second Command byte and the process repeats with a third Command byte, until the Offset count is equal to 15 or some lesser value. At such point the Offset count value in the respective Command byte is set to the remaining Offset count and the Replacement count value is set in accordance with the number of bytes to be replaced.

When the Replacement count of bytes is greater than seven (the maximum value of 3 binary bits), a first Command byte manifests the actual Offset count value from the last differing byte and a Replacement count equal to seven. A second Command byte is inserted after a literal byte (or bytes) which follow the first Command byte. The second Command byte manifests an Offset count of 0—indicating that the next replacement byte starts immediately thereafter, etc.

In such manner, both Offset count and Replacement count values which exceed their maximum bit-limited values are signaled through the use of further Command bytes. No additional hardware is required to recognize and handle optional Offset count bytes or Replacement count bytes (as in the prior art).

Hereafter, hexadecimal encoding will be employed. For reference purposes, it will be recalled that hexadecimal encoding encodes values 0 to 9 using four binary bits and encodes the following values as follows: A=10, B=11, C=12, D=13, E=14 and F=15. Further, in the example given below, one of two data encoding techniques will be indicated by one of two binary values. The two encoding techniques are run length and literal replacement. Literal replacement data means inserting literal byte values from the current block into the encoded block. Run length means inserting one byte that is identical to the bytes that are repeated in the current block. (The run length byte being inserted immediately after the command byte). In deciding whether to use run length or literal replacement, a rule which gives good (but not necessarily optimal) results is: when starting a new command byte, if there is more than one differing byte and the next two bytes are equal, use run length, otherwise use literal replacement.

Hereafter, an example of the encoding procedure will be described in the context of the seed block, current block, and delta block shown in FIGS. 4, 5 and 6. The resulting encoded block is shown in Table 1 below.

An encoded block starts with a Command leader that is the ASCII character "Escape" (0x1B) (ESC). A byte count follows and is encoded in 2 bytes of binary information with the most significant byte first. For example, the two byte value (in hex) 0x01 and 0x05 is 264 (decimal); the two byte value 0x00 and 0x05 is 5 (decimal). A seed block identifier (ID) occurs next and is an ASCII character between "A" and "Z".

A Command byte is defined as follows:

Bit 7 is the encoding flag, where 0 means runlength and 1 means literal replacement.

Bits 6, 5, 4 and 3 are the Offset count. (Thus, a value between 0 and 15).

Bits 2, 1, and 0 are the Replacement count. (Thus a value between 0 and 7).

One possible version of an encoded block is as shown in Table 1. The appearance of the bytes on different lines and indenting is for clarity and is not intended to indicate carriage returns or tabs or spaces.

TABLE 1

(Encoded Block)

"ESC"
0x00 0x12
"A"
    0x93 0x32 0x33 0x34
    0x14 0xFF
    0xF8
    0xE7 0x86 0x87 0x88 0x89 0x8A 0x8B 0x8C
    0x82 0x8D 0x8E

It is important to realize that Table 1 indicates only one of many possible encodings. It happens to be the most efficient encoding, but it is not the only possible encoding.

Encoding starts with the current byte being byte 0 (0x00 in the Current Block of FIG. 5). From the delta block of FIG. 6 it can be seen that the first byte in the current block that differs from the seed block (FIG. 4) is byte 2 (0x32). Thus, the Offset count for the first Command byte is 2. Including the first different byte, there are three contiguous bytes that differ from the seed block (0x32 0x33 0x34 in the current block). Thus, the Replacement count is 3. The three bytes are not the same value, so literal replacement is the encoding method and the encoding flag value is set to 1. The Command byte is constructed as follows:

$$\text{Command Byte} = (0\text{x}01 << 7) \,|\, (0\text{x}02 << 3) \,|\, (0\text{x}03)$$
$$= 0\text{x}93$$

In binary form, the Command byte is 10010011, where the leftmost 1 bit indicates literal replacement; the next four bits (0010) indicate an Offset count of 2; and the next three bits (011) indicate a Replacement count of 3. The hexadecimal encoding of the Command byte is 0x93. The 0x indicates the use of hexadecimal encoding, the four high order bits 1001=9 and the four low order bits=3, thus 0x93.

Since the encoding method is literal replacement, the next three bytes after the command byte are the replacement bytes: 0x32 0x33 0x34. The current byte is then incremented as follows:

$$\text{current byte} = \text{current byte} + \text{Offset count} + \text{Replacement count}$$
$$= 0 + 2 + 3$$
$$= 5$$

From the delta block, the next differing byte is byte 7. The offset for the next Command byte is:

$$\text{Offset count} = \text{next differing byte} - \text{current byte} = 7 - 5 = 2$$

Including the first differing byte, the next four bytes (7–10) are different. Thus, the Replacement count is 4. Further, these four bytes are equal (0xFF), so runlength encoding is the encoding method, and the encoding flag bit value is set to 0. The Command byte is constructed:

$$\text{Command Byte} = (0\text{x}00 << 7) \,|\, (0\text{x}02 << 3) \,|\, (0\text{x}04)$$
$$= 0\text{x}14$$

In binary, the value 0x14=00010100 (Offset count 010=2, Replacement count 0100=4).

Since the encoding method is runlength, the next byte is the runlength value 0xFF. The current byte is next incremented as follows:

$$\text{current byte} = \text{current byte} + \text{Offset count} + \text{Replacement count}$$
$$= 5 + 2 + 4$$
$$= 11$$

From the delta block, the next differing byte is byte 38. The Offset count for the next Command byte is:

$$\text{Offset count} = \text{next differing byte} - \text{current byte}$$
$$= 38 - 11$$
$$= 27$$

This Offset count value is greater than the maximum possible value of 15. Thus, a "zero replacement control word" (ZRCW) is constructed. A ZRCW uses literal replacement encoding and a zero Replacement count. The zero Replacement count, is interpreted as "do nothing". An offset value of 15 is used, and the Command byte is constructed as follows:

$$\text{Command byte} = (0\text{x}01 << 7) \quad (0\text{x}0\text{F} << 3) \quad (0\text{x}00)$$
$$= 0\text{xF8}$$

In binary the Command byte value is 11111000 (where 1111=15 Offset count; 000=Replacement count)

The current byte is next incremented as follows $$\text{current byte} = \text{current byte} + \text{Offset count} + \text{Replacement count}$$
$$= 11 + 15 + 0$$
$$= 26$$

The next differing byte is still byte 38. The Offset count for the next Command byte is $$\text{Offset count} = \text{next differing byte} = \text{current byte}$$
$$= 38 - 26$$
$$= 12$$

Including the first differing byte, the next nine bytes are different. A Replacement count of 9 is greater than the maximum possible value of 7. Thus, the Replacement count is set to 7. Since the next 7 bytes are not equal, literal replacement is the encoding method and the encoding flag bit value is set equal to 1. So, the Command byte is constructed.

$$\text{Command byte} = (0\text{x}01 << 7) \quad (0\text{x}0\text{C} << 3) \quad (0\text{x}07)$$
$$= 0\text{xE7}$$

In binary, the Command byte value is 11100111 (where 1100=12 Offset count, and 111=7 Replacement count).

Since the encoding method is literal replacement, the next seven bytes are 0x86 0x87 0x88 0x89 0x8A 0x8B 0x8C. The current byte is next incremented as follows:

current byte = current byte + Offset count + Replacement count
= 26 + 12 + 7
= 45

The next differing byte is byte 45 because only seven of the bytes from byte 38 were encoded). The Offset count is:

Offset count = next differing byte − current byte
= 45 − 45
= 0

The Replacement count is 2, and since the two bytes are not equal, the encoding method is literal replacement. Therefore, the Command byte is:

Command Byte = (0x01 << 7) ¦ (0x00 << 3) ¦ (0x02)
= 0x82

In binary, the Command byte is 10000010, (where 0000=0 Offset count, 010=2 Replacement count). The 0 value Offset count indicates that the replacement bytes are contiguous to the previous replacement bytes. The next two bytes are 0x8D 0x8E. The current byte is incremented as follows:

current byte = current byte + Offset count + Replacement count
= 45 + 0 + 2
= 47

The end of the block is reached before another differing byte is found, thus the end of the encoded block is reached. The current byte is then set to 0.

So, from the preceding, the encoded block is
0x93 0x32 0x33 0x34 0x14 0xFF 0xF8 0xE7 0x86 0x87 0x88 0x89 0x8A 0x8B 0x8C 0x82 0x8D 0x8E To complete the encoded block, the data Command leader, a byte count of 18 Bytes (=0x00 0x12), and the seed block ID ("A") are prepended to the encoded block.

The decoding procedure employed by the receiver employs the Command bytes and succeeding literal bytes to know what must be inserted and where the insertions should occur in a reconstructed current block. The seed block "fills in the blanks". For instance, if a Command byte manifests a run length encoding bit, a data segment Replacement count of 7 and an offset count of 0, a decoding module inserts after a current byte in a decompressed version of the current block, a number of replacement bytes equal to the data segment Replacement count in the Command byte. Each Replacement byte is identical to the byte next following the Command byte. In a similar vein, if the encoding bit indicates literal replacement, the current byte in the decompressed current block is followed by a number of contiguous bytes that follow the Command byte—as those bytes are literal values from the current block. Lastly, if a Command byte includes an Offset count of 15 and a data segment Replacement count of 0, the Offset count value is accumulated by the decoder and a next contiguous byte is analyzed as a Command byte. If the next Command byte manifests an Offset count of 15 and a data segment Replacement count of 0, the Command byte analysis step is repeated. Otherwise, if a next Command byte manifests a Replacement count of other than 0, the decoder inserts in the decompressed version of the current block, one or more bytes following the last analyzed Command byte at a byte position determined from the accumulated Offset count values.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for data handling comprising the steps of:

storing a current block of data segments;

determining whether each data segment in said current block of data segments is same as or different from a seed value; and producing a compressed version of said current block of data segments, said compressed version including command segments and contiguous data segments from said current block of data segments, each command segment having an encoding identifier, an offset count and a data segment replacement count, said offset count and data segment replacement count each having a maximum value that can be represented thereby, said producing step responding to a determination that a data segment from said current block is different from said seed value and is followed by a series of contiguous data segments in said current block that are different from said seed value, a count of said series of contiguous data segments exceeding said maximum value of said data segment replacement count, by causing (i) a first command segment to manifest a data segment replacement count of said maximum value and an offset count of zero, and (ii) said first command segment to be followed by at least one contiguous data segment from said series, said producing step causing said first command segment to manifest a first encoding identifier, followed by only one said contiguous data segment from said series, if said series of contiguous data segments in said current block are identical; and said producing step further causing, if a remaining number of said contiguous data segments from said series exceeds said maximum value of said data segment replacement count, said one said contiguous data segment from said series to be followed by a second command segment manifesting said first encoding identifier, an offset count of zero, a data segment replacement count exhibiting said maximum value and by at least one said contiguous data segment from said series.

2. The method for data handling as recited in claim 1, further comprising the steps of:

examining said compressed version of said current block to find a command segment; and responding to said command segment including a data segment replacement count of said maximum value, an offset count of zero and a first encoding identifier, to insert after a current data segment in a decompressed current block, a number of replacement data segments equal to said data segment replacement count, each replacement segment identical to a data segment next following said command segment.

3. The method for data handling as recited in claim 1, wherein if said series of contiguous data segments from said current block are each different, said producing step causes said first command segment to manifest a second encoding identifier and be followed by contiguous different data segments from said series equal in number to said maximum value of said data segment replacement count.

4. The method for data handling as recited in claim 3, wherein said producing step causes said contiguous different data segments from said series equal in number to said maximum value of said data segment replacement count, to be followed by a second command segment manifesting said second encoding identifier and by additional ones of said contiguous different data segments from said series, said data segment replacement count exhibiting said maximum value if a remaining number of said contiguous different data segments from said series equals or exceeds said maximum value and a lesser value if the remaining number of said contiguous different data segments are less than said maximum value.

5. The method for data handling as recited in claim 4, wherein said second command segment further manifests an offset count of zero.

6. The method for data handling as recited in claim 3 further comprising the steps of:

examining said compressed version of said current block to find a command segment; and responding to said command segment including a data segment replacement count of said maximum value, an offset count of zero and a second encoding identifier, to insert after a current data segment in a decompressed current block, a number of contiguous data segments from said compressed version of said current block which follow said current data segment, said number of contiguous data segments equal to said data segment replacement count.

7. The method for data handling as recited in claim 1, wherein said seed value comprises a block of data segments all manifesting an identical value.

8. A method for data handling comprising the steps of:

storing a current block of data segments;

determining whether each data segment in said current block of data segments is same as or different from a seed value; and producing a compressed version of said current block of data segments, said compressed version including command segments and contiguous data segments from said current block of data segments, each command segment having an encoding identifier, an offset count and a data segment replacement count, each said offset count and data segment replacement count having a maximum value that can be represented thereby, said producing step responding to a determination that a data segment from said current block is different from said seed value and is separated from a previous different data segment by a greater number of data segments than said maximum value of said offset count, by causing (i) a first command segment to manifest an offset count of said maximum value and a data segment replacement count of zero, and (ii) said first command segment to be followed by at least one or more further command segment(s) manifesting said maximum value or lesser offset counts until a sum of offset counts from said first command segment and said one or more further command segment(s) are equal to said greater number of data segments; and said producing step further examining said compressed version of said current block of data segments to find a command segment; and responding to said command segment including an offset count of said maximum value and a data segment replacement count of zero, to (a) accumulate said offset count value and (b) to analyze a next contiguous data segment as a next command segment, and if said next command segment manifests an offset count of said maximum value and a replacement count of zero, repeating substeps (a) and (b), or if said next command segment manifests a replacement count of other than zero, inserting in a decompressed current block, one or more data segments corresponding to said data segment from said current block that is different from said seed value, following said next command segment at a data segment position determined from the accumulated said offset count value.

9. The method for data handling as recited in claim 8 wherein said seed value comprises a block of data segments all manifesting an identical value.

* * * * *